United States Patent
Ramanathan et al.

(10) Patent No.: US 7,410,884 B2
(45) Date of Patent: Aug. 12, 2008

(54) 3D INTEGRATED CIRCUITS USING THICK METAL FOR BACKSIDE CONNECTIONS AND OFFSET BUMPS

(75) Inventors: Shriram Ramanathan, Portland, OR (US); Sarah E. Kim, Seoul (KR); Patrick R. Morrow, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 437 days.

(21) Appl. No.: 11/284,519

(22) Filed: Nov. 21, 2005

(65) Prior Publication Data

US 2007/0117348 A1  May 24, 2007

(51) Int. Cl.
*H01L 21/46* (2006.01)
*H01L 21/30* (2006.01)

(52) U.S. Cl. .................. 438/455; 438/107; 438/459; 257/686; 257/E25.006; 257/E21.614

(58) Field of Classification Search .................. 438/107, 438/455, 459; 257/686, E25.006, E21.614
See application file for complete search history.

(56) References Cited

U.S. PATENT DOCUMENTS

| | | | |
|---|---|---|---|
| 4,612,083 A * | 9/1986 | Yasumoto et al. | 438/59 |
| 6,762,076 B2 | 7/2004 | Kim et al. | |
| 6,774,477 B2 * | 8/2004 | Han | 257/686 |
| 6,790,748 B2 | 9/2004 | Kim et al. | |
| 6,897,125 B2 | 5/2005 | Morrow et al. | |
| 6,943,440 B2 | 9/2005 | Kim et al. | |
| 2003/0148596 A1 | 8/2003 | Kellar et al. | |
| 2004/0124509 A1 | 7/2004 | Kim et al. | |
| 2005/0003650 A1 | 1/2005 | Ramanathan et al. | |
| 2005/0051894 A1 | 3/2005 | Kim et al. | |
| 2005/0059217 A1 | 3/2005 | Morrow et al. | |
| 2005/0215056 A1 | 9/2005 | Morrow et al. | |
| 2006/0057836 A1 * | 3/2006 | Nagarajan et al. | 438/622 |

* cited by examiner

*Primary Examiner*—Asok K Sarkar
(74) *Attorney, Agent, or Firm*—Blakely, Sokoloff, Taylor & Zafman LLP (57) ABSTRACT

Backside connections for 3D integrated circuits and methods to fabricate thereof are described. A stack of a first wafer over a second wafer that has a substrate of the first wafer on top of the stack, is formed. The substrate of the first wafer is thinned. A first dielectric layer is deposited on the thinned substrate. First vias extending through the substrate to the first wafer are formed in the first dielectric layer. A conductive layer is deposited in the first vias and on the first dielectric layer to form thick conductive lines. Second dielectric layer is formed on the conductive layer. Second vias extending to the conductive lines are formed in the second dielectric layer. Conductive bumps extending into the second vias and offsetting the first vias are formed on the second dielectric layer.

25 Claims, 12 Drawing Sheets

3D INTEGRATED CIRCUITS USING THICK METAL FOR BACKSIDE CONNECTIONS AND OFFSET BUMPS

FIELD

Embodiments of the invention relate generally to the field of semiconductor manufacturing, and more specifically, to backside connections for 3D integrated circuits and methods to fabricate thereof.

BACKGROUND

The packaging density in electronic industry continuously increases to accommodate more electronic devices into a package. Three-dimensional ("3D") wafer-to-wafer stacking technology substantially contributes to the device integration process. Typically, a wafer has layers of integrated circuitry, e.g., processors, programmable devices, memory devices, and the like, built on a silicon substrate. A top layer of the wafer may be connected to a bottom layer of the wafer through silicon interconnects ("vias"). To form a 3D wafer stack, two or more wafers are placed on top of each other and bonded. 3D wafer stacking technology offers a number of potential benefits, including improved form factors, lower costs, enhanced performance, and greater integration through system-on-chip ("SOC") solutions. The 3D wafer stacking technology may provide additional functionality to the chip. After being formed, the 3D wafer stack may be diced into stacked dies ("chips"), each stacked chip having multiple tiers ("layers") of integrated circuitry. SOC architectures formed by 3D wafer stacking can enable high bandwidth connectivity of products, e.g., logic circuitry and dynamic random access memory ("DRAM"), that otherwise have incompatible process flows. There are many applications for 3D wafer stacking technology, including high performance processing devices, video and graphics processors, high density and high bandwidth memory chips, and other SOC solutions.

Figure 1:
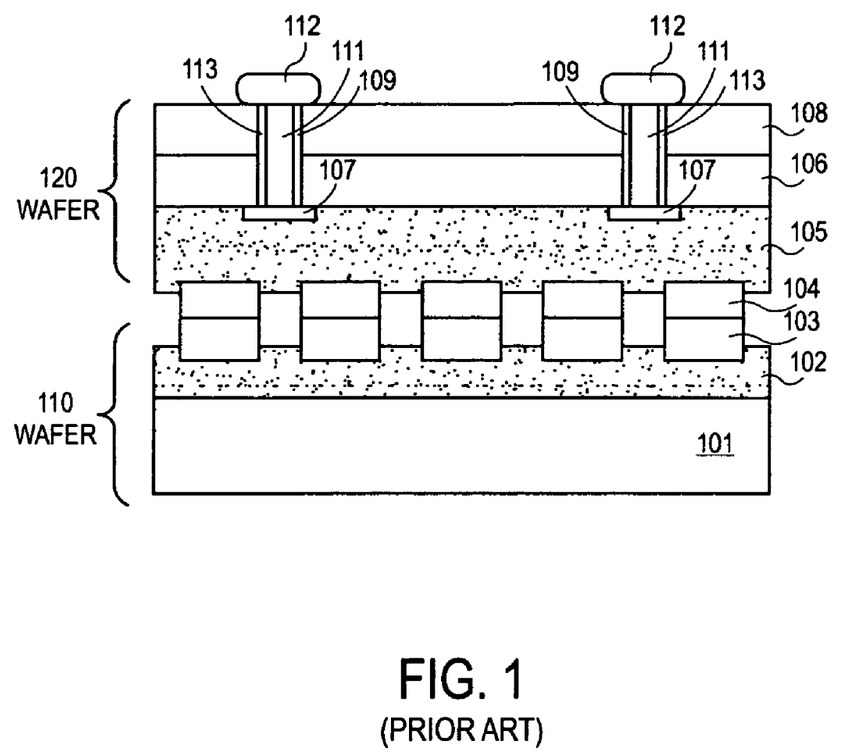
FIG. 1 shows a cross-sectional view of a prior art 3D wafer stack having backside connections.

FIG. 1 shows a cross-sectional view of a typical 3D wafer stack 100 having backside connections. As shown in FIG. 1, wafer 110 has a device region 102 built upon a front side of substrate 101, and wafer 120 has a device region 105 built upon a front side of substrate 106. Typically, each of substrate 101 and substrate 106 is a silicon substrate. Each of device region 102 and device region 105 includes integrated circuitries with active and passive devices. Wafer 110 is bonded to wafer 120 through conductive pads 103 and 104 located in respective device regions 102 and 105, as shown in FIG. 1. As shown in FIG. 1, 3D wafer stack has a dielectric layer 108 on a back side of substrate 106. Backside vias 111 filled with copper extend through the dielectric layer 108 to conductors 107 in device region 106, as shown in FIG. 1. Insulating layer 109 is formed on sidewalls of vias 111, as shown in FIG. 1. Conductive bumps 112 are placed directly on top of vias 111 to form backside connections 113, as shown in FIG. 1.

As shown in FIG. 1, 3D wafer stacked architecture integrates more electronic devices comparing with a conventional planar architecture, such that more electrical power is needed to be supplied through backside connections 113 to device regions 105 and 103. Backside connections 113, however, may deliver to device regions 105 and 103 only limited amount of the electrical power through conductive bumps 112 and vias 111 without being damaged. Backside connections 113 that consist of conductive bumps 112 placed directly vertically on top of vias 111 that are formed in the dielectric layer 108 cause direct vertical stress transfer into dielectric layer 108 and to an interface between 3D wafer stack 100 and a package (not shown). The direct vertical stress deteriorates thermal and mechanical stability of the 3D wafer stack 100. The limited power delivery and stress transfer not only negatively impact the operation, but also cause significant reliability problems for 3D wafer stack 100. Further, present manufacturing flow for backside connections for 3D wafer stack 100 is very complicated and expensive, and involves many additional operations, e.g., to provide additional re-routing capabilities, and to increase the amount of power delivered to electronic devices.

DETAILED DESCRIPTION

In the following description, numerous specific details, for example, specific materials, structures, dimensions of the elements, processes, etc. are set forth in order to provide thorough understanding of one or more of the embodiments of the present invention. It will be apparent, however, to one of ordinary skill in the art that the one or more embodiments of the present invention may be practiced without these specific details. In other instances, semiconductor fabrication processes, techniques, materials, equipment, etc., have not been described in great details to avoid unnecessarily obscuring of this description. Those of ordinary skill in the art, with the included description, will be able to implement appropriate functionality without undue experimentation.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 2:
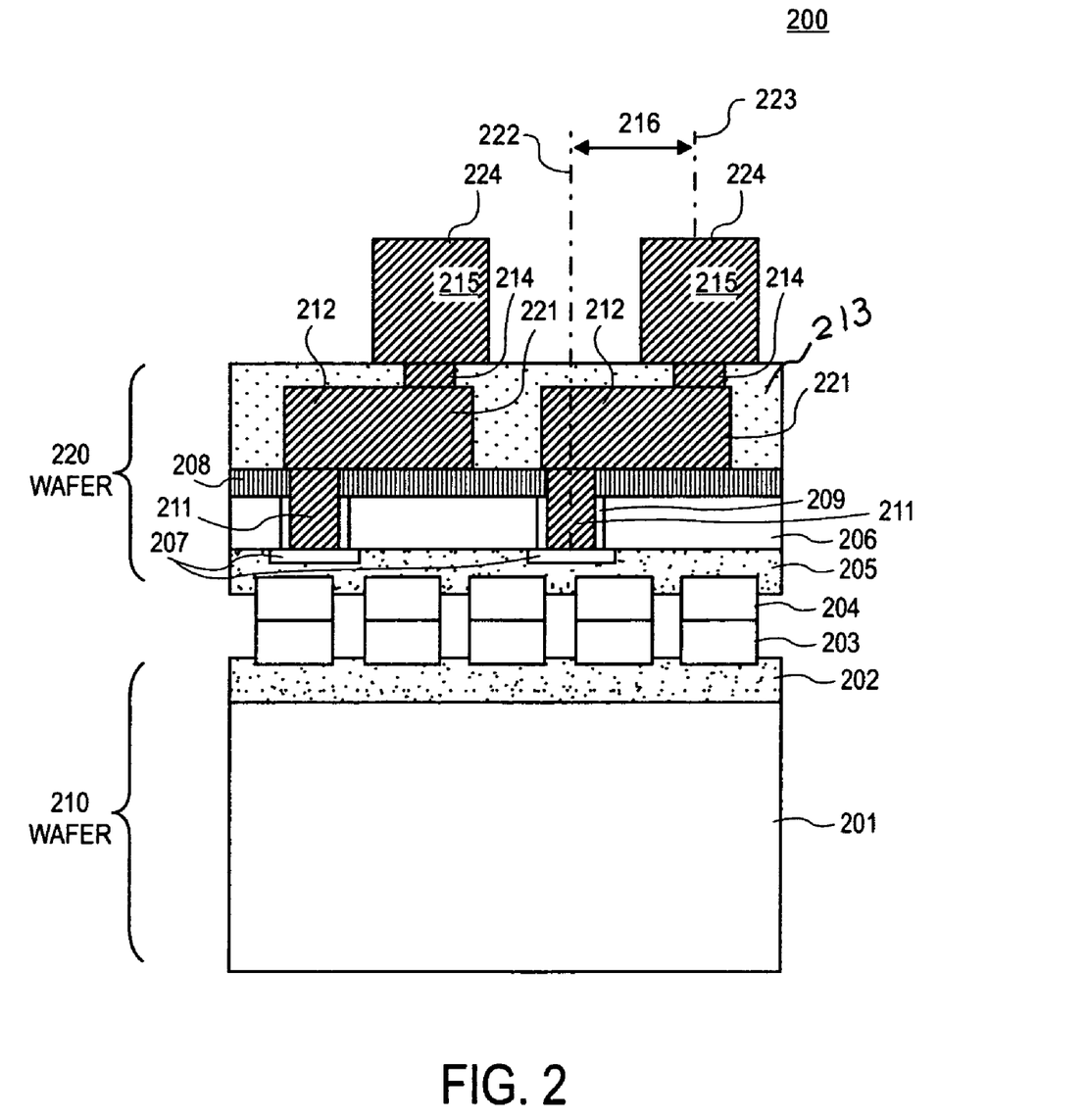
FIG. 2 shows a cross-sectional view of one embodiment of backside connections for a 3D wafer stack.

Backside connections for 3D integrated circuits and methods to fabricate thereof are described herein. FIG. 2 shows a cross-sectional view of one embodiment of backside connections 224 for 3D wafer stack 200. As shown in FIG. 2, 3D wafer stack 200 includes a wafer 220 placed ("vertically stacked") on a wafer 210. Wafer 210 has a device layer 202 on a front side of a substrate 201, and conductive pads 203, e.g., metal bumps, or copper bond pads, located in device layer 202. Wafer 220 has a device layer 205 on a front side of a substrate 206, and conductive pads 204, e.g., metal bumps, or copper bond pads, located in device layer 205. Wafer 210 and 220 are bonded together using respective conductive pads 203 and 204 to form a vertical stack, such that substrate 206 of wafer 220 is above device layer 205, which faces device layer 203 on substrate 201 of wafer 210, as shown in FIG. 2. In one embodiment, each of substrates 201 and 206 includes a monocrystalline silicon substrate. In alternate embodiments, each of substrates 201 and 206 may comprise any material, e.g., silicon on-insulator ("SOI"), Gallium Arsenide ("GaAs"), Germanium ("Ge"), SiGe, and the like. In another embodiment, substrates 201 and 206 may include glass, or quartz. Each of device layers 202 and 205 includes one or more metallization layers of integrated circuits having active and passive devices, e.g., transistors, switches, optoelectronic devices, capacitors, resistors, interconnects that are formed on substrates 201 and 206 respectively. The one or more metallization layers of integrated circuits are separated from adjacent metallization layers by dielectric material, e.g., interlayer dielectric ("ILD"). The adjacent metallization layers may be electrically interconnected by vias. A dielectric layer 208 is formed on thinned substrate 206, as shown in FIG. 2. Thinning the substrate is described in further detail below with respect to FIG. 4. In one embodiment, dielectric layer 208 is a nitride, oxide, or polymer layer. Backside vias 211 are formed in dielectric layer 209 that extend through substrate 206 to conductor 207 in device layer 205, as shown in FIG. 2. Forming backside through silicon vias 211 is described in further details below with respect to FIGS. 5-12. Insulating layer 209 covers sidewalls of backside vias 211, as shown in FIG. 2. Forming the insulating layer on the back side of the substrate is described in further details below with respect to FIGS. 8-10. Conductive layer 221 is deposited into backside vias 211 and onto dielectric layer 209, as shown in FIG. 2. Conductive layer 221 forms conductive lines 212 on dielectric layer 209, as shown in FIG. 2. In one embodiment, conductive lines have the thickness of at least 10 microns ("um"). Forming the conductive layer is described in further detail below with respect to FIGS. 11-15. A dielectric layer 213 is formed on and between conductive lines 212 on dielectric layer 209. Openings 214 are formed in dielectric layer 213. Conductive bumps 213 are deposited onto dielectric layer 213 that extend through openings 214 to conductive lines 212. Conductive bumps 215 are used for electrical power delivery to device layers 205 and 203 and for input/output connections of wafer stack 200. During a die/package attaching process, conductive bumps 215 are coupled to conductive lands, and/or bumps, of a package (not shown). In one embodiment, conductive bumps 215 are formed using Controlled Collapse Chip Connection ("C4") technology. C4 technology is known to one of ordinary skill in the art of semiconductor manufacturing. As shown in FIG. 2, conductive bumps 215 offset vias 211, such that vertical central axis 223 of conductive bumps 211 is offset horizontally relative to vertical central axis 222 of vias 211. Depositing conductive bumps 215 that have an offset 216 from backside vias is described in further detail below with respect to FIGS. 16-21. Backside connections 224 including thick conductive lines 221 that connect offset conductive bumps 215 and backside vias 211 improve electrical power delivery to device layers 205 and 203 of wafer stack 200, and increase re-routing capabilities for input/output signals on the back side of wafer stack 200, as described in further detail below. Further, backside connections 224 for wafer stack 200, which include thick conductive lines 221 and offset bumps 215, improve thermomechanical ability, e.g., substantially reduce mechanical stress in a low-k ILD layer of wafer stack 200 and at a chip-package interface (not shown) that may be induced during packaging. Additionally, backside connections 224 for 3D wafer stack 200 are fabricated using simplified manufacturing flow, as described in further details below with respect to FIGS. 3-21.

Figure 3:
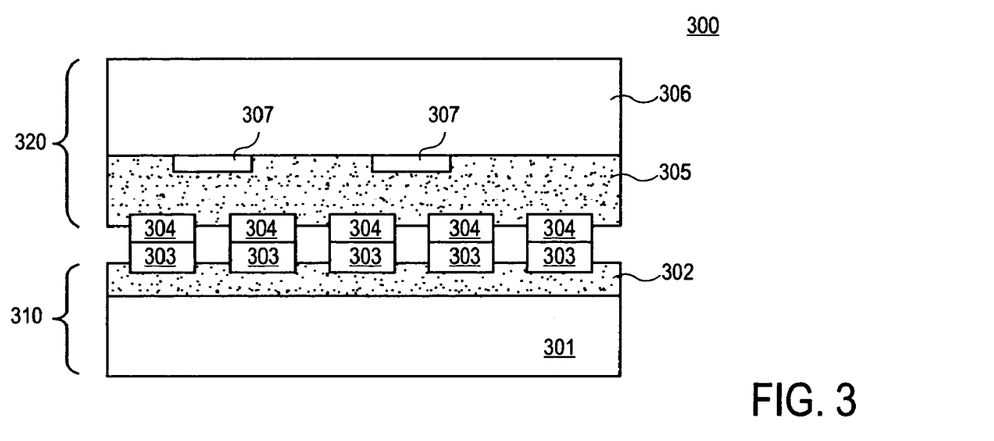
FIG. 3 is a cross-sectional view of one embodiment of a 3D wafer stack to fabricate backside connections.

FIG. 3 is a cross-sectional view of one embodiment of a 3D wafer stack 300 to fabricate backside connections. First, to form a 3D vertical wafer stack 300, a wafer 320 is placed over a wafer 310, as shown in FIG. 3. Wafer 310 has a device layer 302 that is formed on a substrate 301, and wafer 320 has a device layer 305 that is formed on a substrate 306. In one embodiment, each of substrates 301 and 306 includes a monocrystalline silicon substrate. In alternate embodiments, each of substrates 301 and 306 may comprise any material, e.g., silicon on-insulator ("SOI"), Gallium Arsenide ("GaAs"), Germanium ("Ge"), SiGe, and the like. In another embodiment, substrates 301 and 306 include glass, or quartz. In one embodiment, wafer 320 and wafer 310 comprise the same material. In another embodiment, wafer 320 and wafer 310 comprise different materials. Each of device layers 302 and 305 include one or more metallization layers of integrated circuits having active and passive devices, e.g., transistors, switches, optoelectronic devices, capacitors, resistors, interconnects that are formed on substrates 301 and 306 respectively. The one or more metallization layers of integrated circuits are separated from adjacent metallization layers by dielectric material, e.g., interlayer dielectric ("ILD"). The adjacent metallization layers may be interconnected by vias. As shown in FIG. 3, device layer 305 includes conductors 307, e.g., conductive lines, or metal lands that provide electrical connection to one or more devices in device layer 305. As shown in FIG. 3, conductors 307 are located adjacent to substrate 106. As shown in FIG. 3, device layer 305 faces device layer 302 on substrate 301, such that the back side of substrate 306 of wafer 320 is positioned on a top of 3D wafer stack 300. As shown in FIG. 3, conductive pads 304 located in device layer 305 are aligned with respective conductive pads 303 located in device layer 302 and bonded, as shown in FIG. 3. In one embodiment, conductive pads 303 and 304 are metal bumps, or bonding pads, formed by patterning respective metal bonding layers on top surfaces of device layers 302 and 305. In one embodiment, conductive pads 303 and 304 include copper, aluminum, or any other conductive material known to one of ordinary skill in the art of semiconductor manufacturing. In one embodiment, conductive pads 303 and 304 are bonded together in a bond chamber with heat and pressure applied through a standard rigid press, as known to one of ordinary skill in the art of semiconductor manufacturing. In one embodiment, conductive pads are bonded at a temperature in the approximate range of 200-500° C. and a force in the approximate range of 0.5-100 kilonewtons ("KN").

Figure 4:
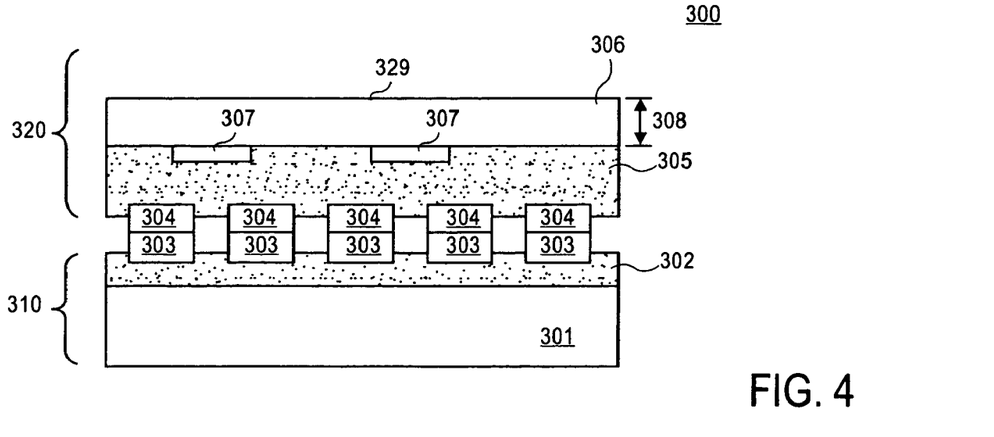
FIG. 4 is a view similar to FIG. 3, after thinning a substrate of a 3D wafer stack from a back side down.

FIG. 4 is a view similar to FIG. 3, after thinning substrate 306 of wafer 320 from the back surface 321 down. In one embodiment, silicon substrate 306 of wafer 320 is thinned down to the thickness 108, which is needed to fabricate through silicon via with an aspect ratio of the diameter to the depth in the approximate range of 1:10 to 1:100 later on in the process. In one embodiment, substrate 306 is thinned down to the thickness 108 in the approximate range of 5 um to 100 um. In another embodiment, substrate 306 is thinned down to the thickness 108 of at least 30 microns. In one embodiment, silicon substrate 306 is thinned down by mechanical grinding using grinding wheel. Mechanical grinding is known to one of ordinary skill in the art of semiconductor manufacturing. In alternate embodiments, substrate 306 may be thinned using any chemical, mechanical, or chemical-mechanical techniques known to one of ordinary skill in the art of semiconductor manufacturing, e.g., etching, polishing, or chemical-mechanical polishing techniques.

Figure 5:
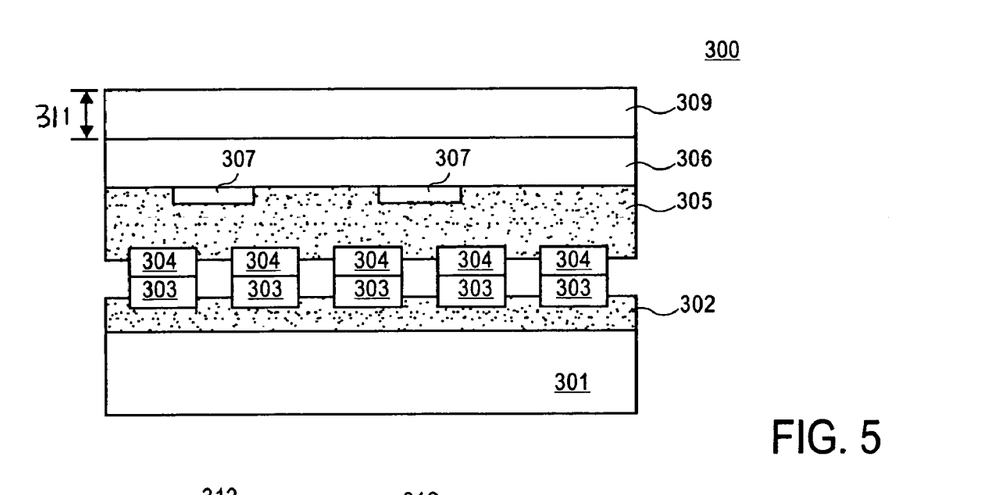
FIG. 5 is a view similar to FIG. 4, after a first dielectric layer is deposited on a thinned substrate of a 3D wafer stack.

FIG. 5 is a view similar to FIG. 4, after a dielectric layer 309 is deposited on the thinned substrate 306. In one embodiment, dielectric layer 309 deposited on the thinned silicon substrate 306 includes an oxide material, a nitride material, a polymer material, or any combination thereof. In one embodiment, dielectric layer 309 deposited on the thinned silicon substrate 306 is silicon oxide. In another embodiment, dielectric layer 309 is silicon nitride. Dielectric layer 309 may be deposited using any suitable deposition technique. In one embodiment, dielectric layer 309 may be deposited using blanket deposition technique, for example, chemical vapor deposition ("CVD"), sputtering, spinning-on, or another thin film deposition technique. Dielectric layer 309 is deposited to thickness 111 in the approximate range of 100 nm to 2 um.

Figure 6:
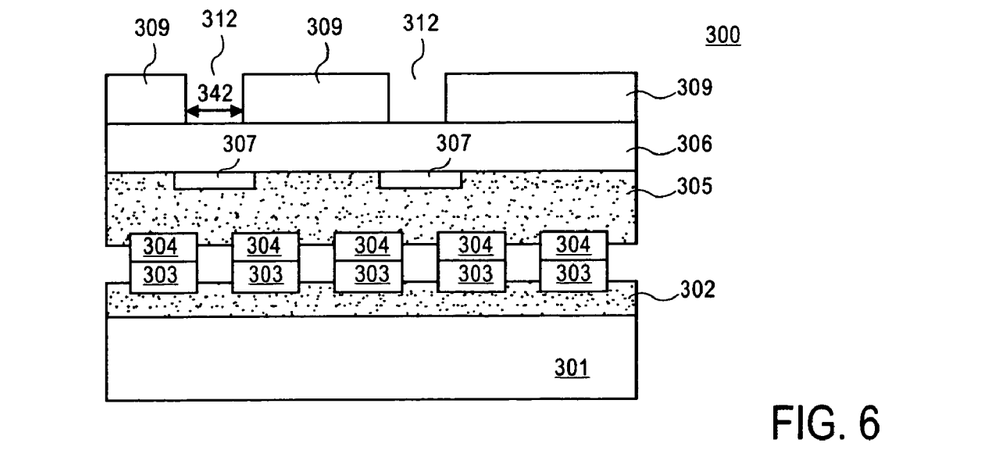
FIG. 6 is a view similar to FIG. 5, after the first dielectric layer is patterned and etched to form openings that expose portions of the thinned substrate.

FIG. 6 is a view similar to FIG. 5, after dielectric layer 309 is patterned and etched to form openings 312 that expose portions of substrate 306. A photoresist (not shown) is deposited on the dielectric layer 309, patterned, and then etched to form openings 312. Patterning and etching of dielectric layer 309, e.g., oxide, nitride, and polymer, deposited on substrate is known to one of ordinary skill in the art. In one embodiment, each of openings 312 in dielectric layer 309 of nitride formed on silicon substrate 306 has a diameter 342 in the approximate range of 2 um to 30 um. In another embodiment, the diameter of each of openings 312 is determined by the diameter of each of through vias formed in substrate 306 later on in the process. It will be appreciated by those of ordinary skill in the art that the diameter of openings 312 may be determined by the aspect ratio of a via that can be achieved by the equipment and processes used to form through vias in substrate 306 later on in the process. Generally, the vias may have a substantially high aspect ratio of a depth to a diameter, for example, in the approximate range of 10:1 to 100:1.

Figure 7:
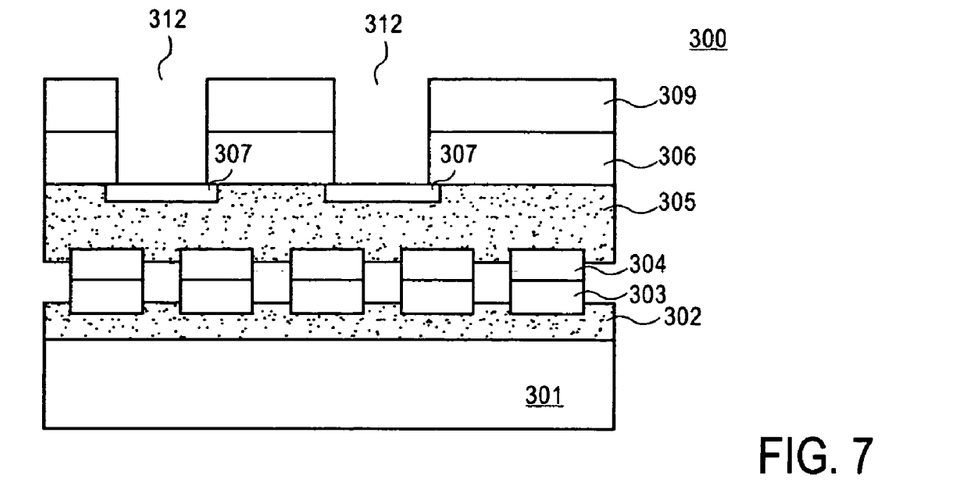
FIG. 7 is a view similar to FIG. 6, after openings are formed in exposed portions of the thinned substrate using the first dielectric layer as a hard mask.

FIG. 7 is a view similar to FIG. 6, after openings 332 ("vias") are formed in exposed portions of substrate 306 using dielectric layer 309 as a hard mask. Vias 332 extend through substrate 306 down to conductors 307 located in device layer 305 adjacent to substrate 306. As shown in FIG. 7, vias 332 formed through substrate 306 expose portions of conductors 307. In one embodiment, vias 332 are formed by etching openings through patterned dielectric layer 309 and substrate 306 down to conductors 307. In one embodiment, diameter of each of vias 332 that extend through silicon substrate 306 is defined by the diameter of openings 312 in dielectric layer 309. In one embodiment, the diameter of each of vias 332 etched through silicon substrate 306 using nitride dielectric layer 309 as a hard mask is in the approximate range of 2 um to 30 um. In one embodiment, vias 332 are etched using dry etching, wet etching, or a combination thereof, through silicon substrate 306 utilizing nitride dielectric layer 309 as a hard mask. Etching vias 332 in silicon substrate 306 is known to one of ordinary skill in the art.

Figure 8:
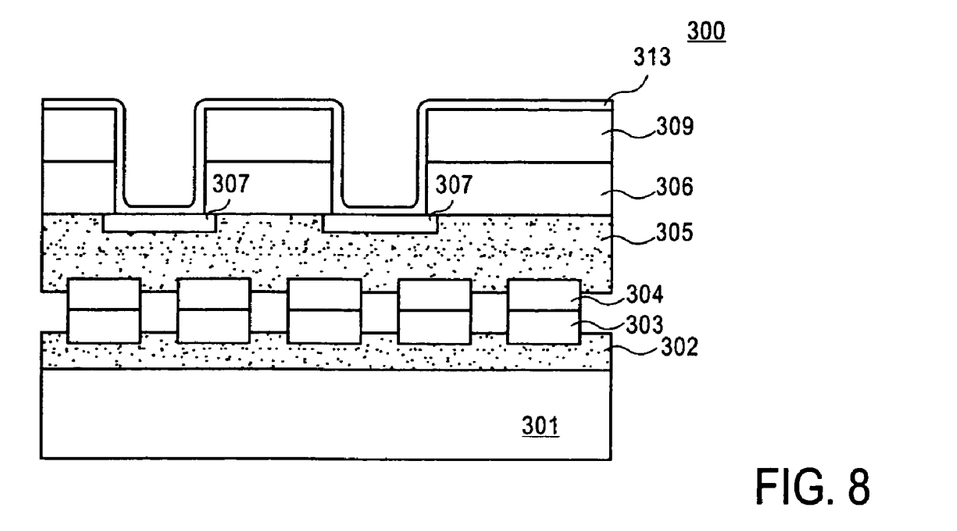
FIG. 8 is a view similar to FIG. 7, after an insulating layer is formed on the first dielectric layer.

FIG. 8 is a view similar to FIG. 7, after an insulating layer 313 is formed on dielectric layer 309 covering exposed portions of conductors 307 and sidewalls of vias 332. In one embodiment, insulating layer 313 deposited on dielectric layer 309 has the thickness in the approximate range of 50 nanometers ("nm") to 500 nm. More specifically, the thickness of insulating layer 313 is about 200 nm. In one embodiment, insulating layer 313 is an oxide, e.g., silicon oxide. In another embodiment, insulating layer 313 is a nitride, e.g., silicon nitride. In one embodiment, insulating layer 313 includes any insulating material, e.g., one or more polymer material. In one embodiment, insulating layer 313 may be deposited onto dielectric layer 309 as a spacer using a blanket deposition technique, e.g., CVD, sputtering, or another thin film deposition technique known to one of ordinary skill in the art of semiconductor manufacturing.

Figure 9:
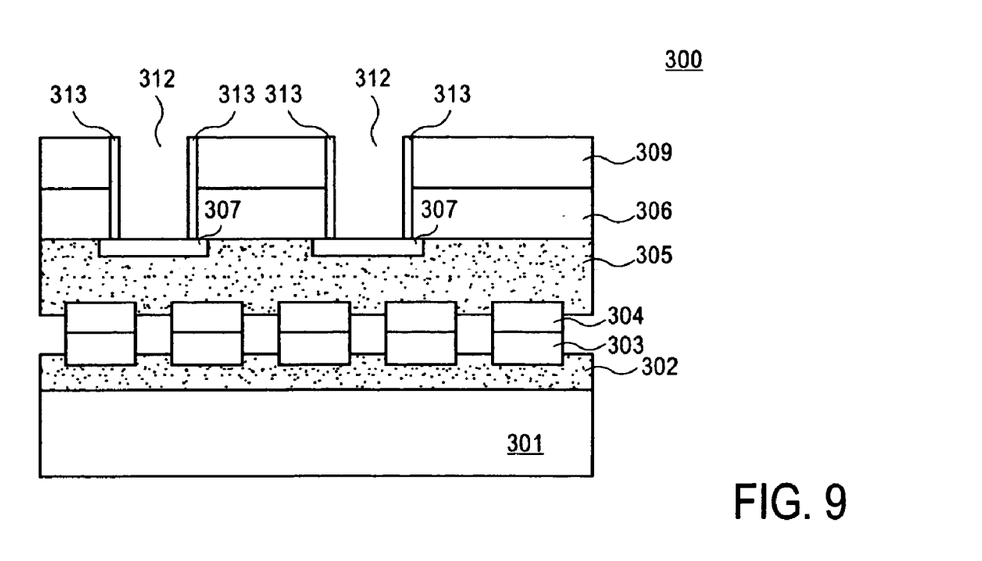
FIG. 9 is a view similar to FIG. 8, after the insulating layer is patterned and etched to cover sidewalls of vias 332.

FIG. 9 is a view similar to FIG. 8, after insulating layer 313 formed on dielectric layer 309 is patterned and etched away from a top surface of dielectric layer 309 and the portions of conductors 307 while covering sidewalls of vias 332. As shown in FIG. 9, insulating layer 313 covers sidewalls of vias 332. Vias 332 are filled with a conductive material, e.g., copper, later on in the process. Insulating layer 313 is deposited on sidewalls of vias 332 to prevent diffusion of the conductive material, e.g., copper, into silicon substrate 306. In another embodiment, insulating layer 313 covering sidewalls of vias 332 includes one or more layers of other insulating materials, e.g., a layer of polyimide may be deposited on insulating layer 313 of nitride covering sidewalls of through silicon vias 332, as described below with respect to FIG. 9. It will be appreciated by those of ordinary skill in the art that insulating layer 313 may be formed on sidewalls vias 313 using techniques other than blanket deposition. For example, vias 332 may be filled with insulating material, e.g., an oxide, such that "insulating plugs" in vias 332 are formed. Next, openings may be etched within "insulating plugs", such that central portions of "insulating plugs" are removed to expose portions of conductors 307, while portions of insulating material, which are adjacent to sidewalls of vias 332, are left intact that results in the structure shown in FIG. 9. Etching the openings in "insulating plugs" may be performed by one of etching techniques known to one of ordinary skill in the art, e.g., using dry etching, wet etching, or any combination thereof.

Figure 10:
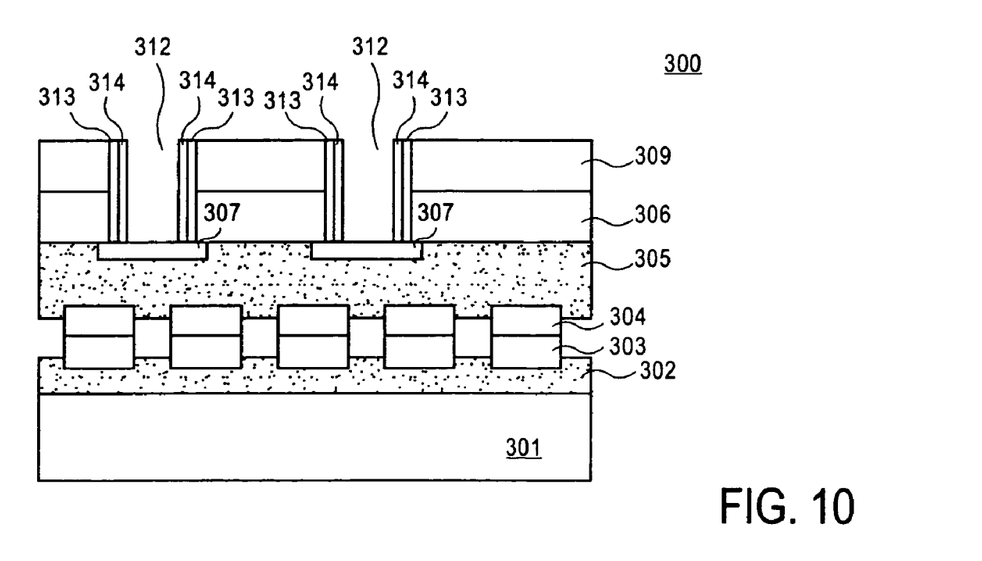
FIG. 10 is a view similar to FIG. 9, after another insulating layer is formed on the insulating layer, which covers sidewalls of vias, according to another embodiment of the invention.

FIG. 10 is a view similar to FIG. 9, after another insulating layer 314 is formed on insulating layer 313, which covers sidewalls of vias 332, according to another embodiment of the invention. Another insulating layer 314 is formed to extend stress margins of vias 332 by acting as a cushion when vias 332 are filled with a conductive material later on in a process. The conductive material may thermally expand or contract in vias 332 thereby inducing a stress onto substrate 306. Placing another insulating layer 314 on insulating layer 313 mitigates the stress that may be induced onto silicon substrate 306. In one embodiment, the thickness of another insulating layer 314 is in the approximate range of 50 nm to 500 nm. Insulating layer 314 is deposited on insulating layer 313, which covers top portions of dielectric layer 309, sidewalls of vias 332, and portions of conductors 307, and patterned. Next, insulating layer 314 together with underlying insulating layer 313 are etched away to expose the top portions of dielectric layer 309 and portions of conductors 307 while leaving insulating layer 314 together with underlying insulating layer 313 on sidewalls of through vias 332 intact, as shown in FIG. 10. Patterning and etching techniques to remove insulating layer 314 with underlying insulating layer 313 from dielectric layer 309 and portions of conductors 307 are known to one of ordinary skill in the art of semiconductor manufacturing. In one embodiment, another insulating layer 314 is a ILD layer, e.g., a polyimide, deposited on insulating layer 313 of nitride using one of a blanket deposition techniques, e.g., a spin-on technique, or CVD technique. Blanket deposition techniques are known to one of ordinary skill in the art of semiconductor manufacturing.

Figure 11:
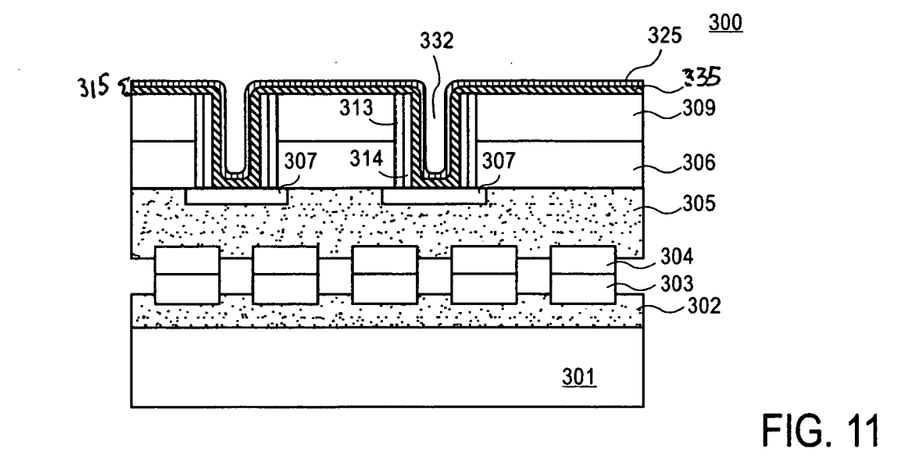
FIG. 11 is a view similar to FIG. 10, after a first base layer is formed on the insulating layer, on exposed portions of conductors of a device layer and on the first dielectric layer.

FIG. 11 is a view similar to FIG. 10, after a conductive base layer 315 is formed on insulating layer 314 of vias 332, on the exposed portions of conductors 307 and on dielectric layer 309. It should be appreciated to those of ordinary skill in the art that forming the insulating layer 314 is optional, and conductive base layer 315 may be formed directly on insulating layer 313 covering the sidewalls of vias 332, on the exposed portions of conductors 307 and on dielectric layer 309. In one embodiment, conductive base layer 315 includes a seed layer 325 deposited on conductive barrier layer 335 (barrier layer metal "BLM"), as shown in FIG. 10. In one embodiment, seed layer 325 includes copper, and conductive barrier layer 335 includes aluminum, titanium, tantalum, tantalum nitride, and the like metals. In one embodiment, conductive barrier layer 335 acts as a diffusion barrier layer to prevent diffusion of conductive material from seed layer 325, e.g., copper, into substrate 306, and provides adhesion for seed layer 325 (e.g., copper). In one embodiment, first, conductive barrier layer 325 is deposited onto dielectric layer 309, the exposed portions of conductors 307, and on insulating layer 314 (or on insulating layer 313) covering sidewalls of vias 332. Next, seed layer 325 is deposited on conductive barrier layer 335. In another embodiment, conductive base layer 315 includes seed layer 325 deposited directly onto dielectric layer 309, the exposed portions of conductors 307, and on insulating layer 314 (or on insulating layer 313) covering sidewalls of vias 332. Each of conductive barrier layer 335 and seed layer 325 may be deposited using any thin film deposition technique known to one of ordinary skill in the art of semiconductor manufacturing, e.g., by sputtering, blanket deposition, and the like. In one embodiment, each of conductive barrier layer 335 and seed layer 325 has the thickness in the approximate range of 10 to 300 nm. In one embodiment, conductive barrier layer 335, e.g., titanium, has the thickness of about 100 nm, and seed layer 325, e.g., copper, has the thickness of about 200 nm. The choice of a material for seed layer 325 may vary with a choice of a material of a subsequent conductive layer, as described in further detail below.

Figure 12:
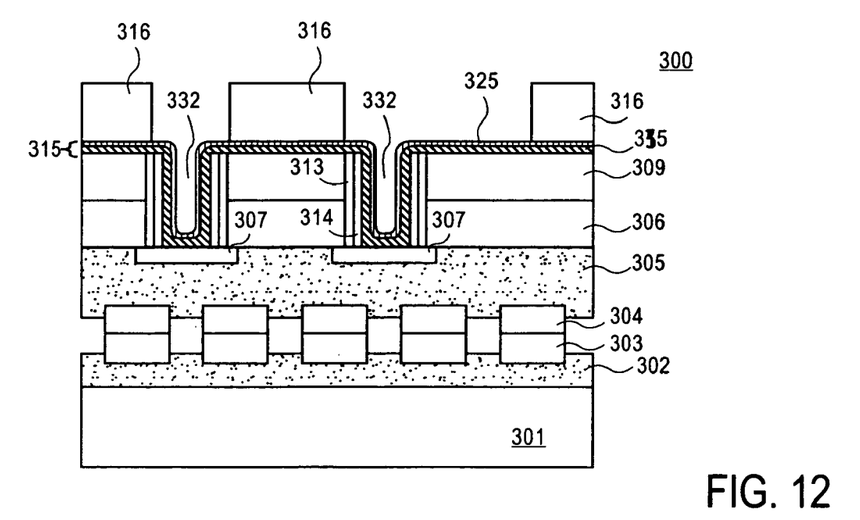
FIG. 12 is a view similar to FIG. 11, after patterning and etching a photoresist deposited on a seed layer of the first base layer.

FIG. 12 is a view similar to FIG. 11, after patterning and etching a photoresist 316 deposited on seed layer 325. As shown in FIG. 12, photoresist 316 is patterned and etched to expose portions of conductive base layer 315 covering sidewalls and bottom of vias 332 and portions of dielectric layer 309. Patterning and etching of photoresist 316 is known to one of ordinary skill in the art of semiconductor manufacturing.

Figure 13:
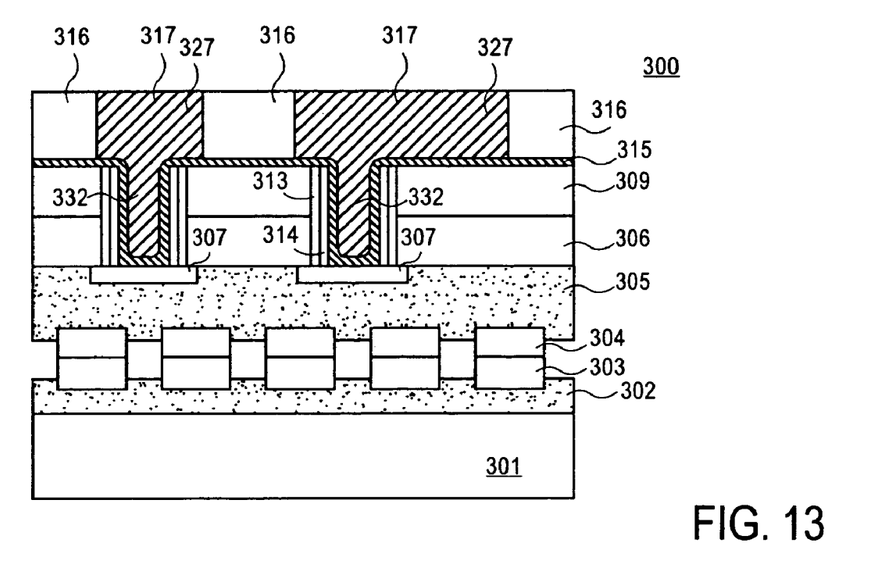
FIG. 13 is a view similar to FIG. 12, after a conductive layer is deposited onto portions of the seed layer not covered by the photoresist.

FIG. 13 is a view similar to FIG. 12, after a conductive layer 317 is deposited onto portions of seed layer 325 not covered by photoresist 316. As shown in FIG. 13, conductive layer 317 is deposited such that a portion of conductive layer 317 fills vias 332 and another portion of conductive layer 317 forms conductive lines 327 over dielectric layer 306. In one embodiment, conductive layer 317 e.g., copper, is deposited onto exposed portions of seed layer 325 e.g., copper by an electroplating process. During electroplating process, e.g., using a Secor™ technology, a conductive material, e.g., copper, of conductive layer 317 is plated into vias 332 while creating conductive lines 327. In one embodiment, conductive layer is deposited onto portions of seed layer 325 using one of selective deposition technique known to one of ordinary skill in the art of semiconductor manufacturing, e.g., electroplating, electroless plating, and the like. In one embodiment, the choice of a material for conductive layer 317 determines the choice of a material for seed layer 325. For example, if the material for conductive layer 317 includes copper, the material for seed layer 325 also includes copper.

Figure 14:
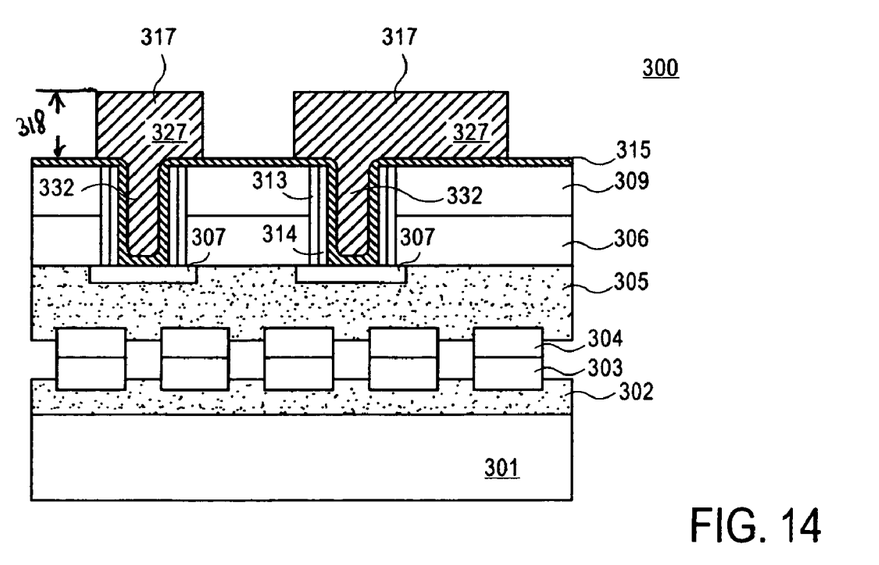
FIG. 14 is a view similar to FIG. 13, after the photoresist is removed exposing portions of the first base layer.

FIG. 14 is a view similar to FIG. 13, after photoresist 316 is removed exposing portions of conductive base layer 315. As shown in FIG. 14, conductive layer 317 fills vias 332, and forms conductive lines 327 that extend on vias 332 and onto conductive base layer 315 covering the top portions of dielectric layer 309. In one embodiment, the thickness 338 of conductive lines 327 is at least about 10 um. In another embodiment, the thickness 338 of conductive lines 327 is in the approximate range of 10 um to 100 um. Photoresist 316 may be removed using one of technique known to one of ordinary skill in the art of semiconductor manufacturing, e.g., using plasma etch ("ash"), or may be mechanically stripped off.

Figure 15:
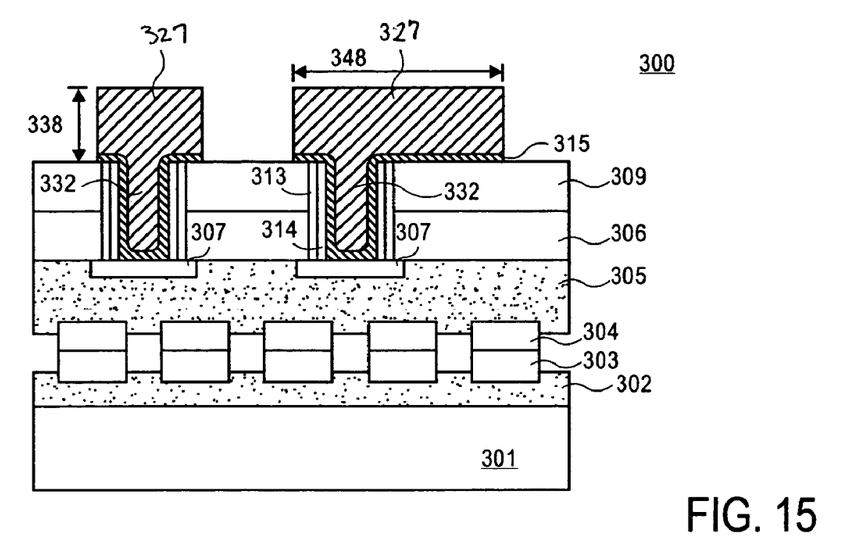
FIG. 15 is a view similar to FIG. 14, after the portions of the first base layer not covered by the conductive layer are removed to expose top portions of the first dielectric layer.

FIG. 15 is a view similar to FIG. 14, after the portions of conductive base layer 315 not covered by conductive layer 317 are removed to expose top portions of dielectric layer 309. The uncovered portions of conductive base layer 315 may be removed chemically, e.g., by etching, mechanically, e.g. by polishing, or using a combination thereof, as known to one of ordinary skill in the art of semiconductor manufacturing. In one embodiment, conductive layer 317 having the thickness 338 of at least about 10 um provides a stress buffer for backside connections of 3D wafer stack 300 formed later on in the process. As shown in FIG. 15, conductive lines 327 extending over vias 332 and onto top surface of dielectric layer 309 provide re-routing capabilities for backside connections of 3D wafer stack 300. In one embodiment, the width 328 of conductive lines 327 may be determined by re-routing requirements for 3D wafer stack 300, and is in the approximate range of 5 um to 100 um.

Figure 16:
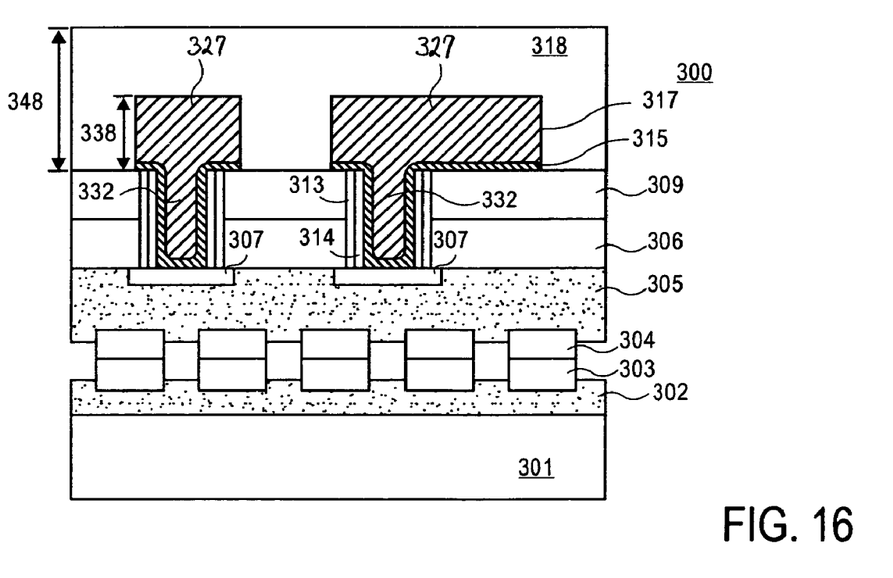
FIG. 16 is a view similar to FIG. 14, after a second dielectric layer is deposited onto the conductive layer and onto exposed top portions of the first dielectric layer.

FIG. 16 is a view similar to FIG. 14, after a dielectric layer 318 is deposited onto conductive layer 317 and onto exposed top portions of dielectric layer 309. The thickness of dielectric layer 318 may vary with a thickness of conductive layer 317. As shown in FIG. 16, dielectric layer 318 conformingly covers exposed top portions of dielectric layer 309, tops and sidewalls of conductive lines 327, and fills the areas between conductive lines 327. In one embodiment, the thickness 338 of conductive layer 317 is in the approximate range of 10 um to 100 um, and the thickness of dielectric layer 318 is in the approximate range of 20 um to 200 um. In one embodiment, dielectric layer 318 is a spin-on interlayer dielectric (ILD), e.g., polyimide, epoxy, photodefinable materials, such as benzocyclobutene ("BCB"), and WPR-series materials, glass, or silicon dioxide. In one embodiment, dielectric layer 318 is a low permittivity ("low-k") ILD layer deposited onto conductive layer 317 of copper and exposed portions of dielectric layer 309 of nitride, or oxide. Typically, "low-k" is referred to the dielectrics having permittivity ("k") lower than the permittivity of silicon dioxide. In another embodiment, dielectric layer 318 is deposited onto conductive layer 317 and onto exposed top portions of dielectric layer 309 using any blanket deposition techniques known to one of ordinary skill in the art of semiconductor manufacturing, by spinning-on, CVD, or sputtering technique.

Figure 17:
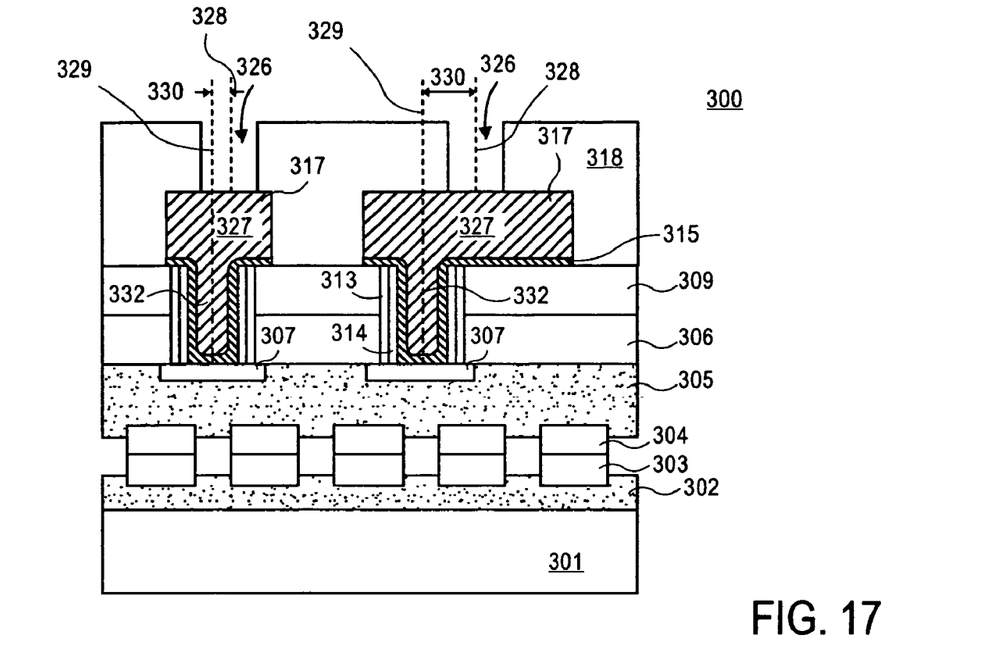
FIG. 17 is a view similar to FIG. 16, after the second dielectric layer is patterned and etched to form openings for conductive pads.

FIG. 17 is a view similar to FIG. 16, after dielectric layer 318 is patterned and etched to form openings 326 ("vias") for conductive pads, which are formed later on in the process. Openings 326 expose portions of conductive lines 327 of conductive layer 317, as shown in FIG. 17. Openings 326 in dielectric layer 318 may be formed to expose any portion of conductive lines 327. That is, locations and quantity of openings 326 are independent on locations and quantities of vias 332. As shown in FIG. 17, openings 326 offset vias 332, such that a vertical central axis 328 of each of openings 326 is shifted by a distance 330 relative to a vertical central axis 329 of each of vias 332. In one embodiment, at least one of the openings 326 is offset from vias 332. In one embodiment, distance 330 is defined by design, e.g., re-routing requirements, for 3D wafer stack, and is in the approximate range of 50 um to 1 mm. In one embodiment, a diameter of each of openings 326 in low-k ILD layer 318 is in the approximate range of 2 um to 30 um. In another embodiment, the diameter of each of openings 326 to form vias is determined by aspect ratios of the vias, which are in the approximate range of 1:10 to 1:100. Techniques to pattern and etch dielectric layer 318 are known to one of ordinary skill in the art of semiconductor manufacturing.

Figure 18:
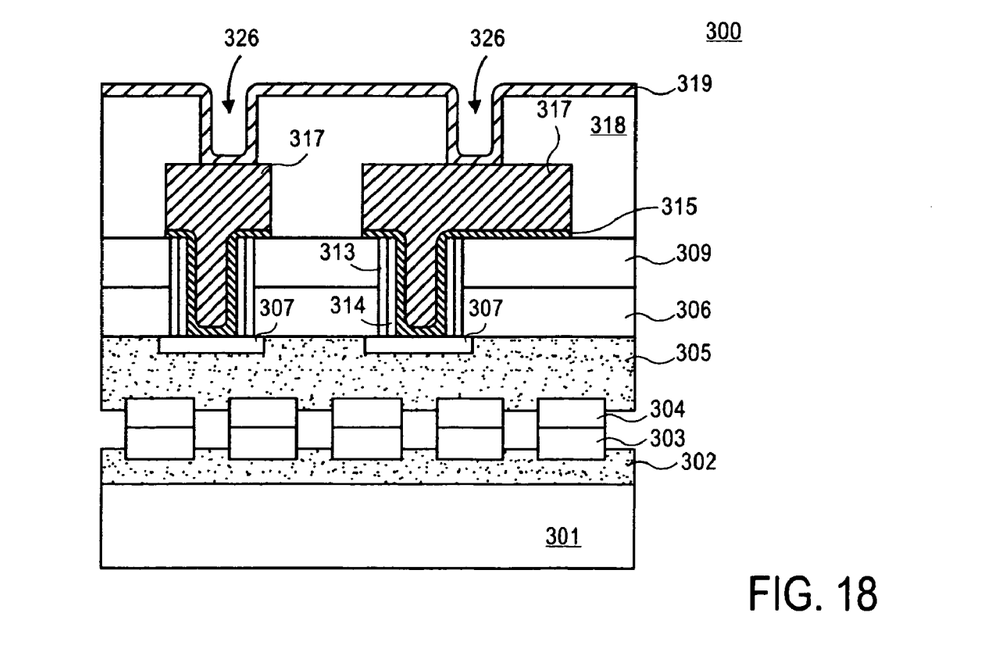
FIG. 18 is a view similar to FIG. 17, after a second base layer is deposited onto the second dielectric layer.

FIG. 18 is a view similar to FIG. 17, after a conductive base layer 319 is deposited onto dielectric layer 318 that covers internal sidewalls of openings 326 and the exposed portions of conductive lines 327 within openings 326. In one embodiment, conductive base layer 319 includes a seed layer (not shown) deposited on a conductive barrier layer (barrier layer metal "BLM") (not shown), as described above with respect to conductive base layer 315 of FIG. 10. In one embodiment, the seed layer of conductive base layer 319 includes copper, and the conductive barrier layer of conductive base layer 319 includes aluminum, titanium, tantalum, cobalt, tantalum nitride, and the like metals. In one embodiment, the conductive barrier layer of conductive base layer 319 acts as a diffusion barrier layer to prevent diffusion of conductive material from the seed layer of conductive base layer 319, e.g., copper, into dielectric layer 318, and also provides adhesion for the seed layer (e.g., copper). In one embodiment, to form conductive base layer 319, the conductive barrier layer (not shown) is deposited onto dielectric layer 318, the exposed portions of conductive lines 327, and onto internal sidewalls of openings 326. Next, the seed layer (not shown) is deposited on the conductive barrier layer. In another embodiment, conductive base layer 319 includes the seed layer deposited directly onto dielectric layer 318, the exposed portions of conductive lines 327, and onto internal sidewalls of openings 326. The conductive barrier layer and the seed layer of conductive base layer 319 may be deposited using any thin film deposition technique known to one of ordinary skill in the art of semiconductor manufacturing, e.g., by sputtering, blanket deposition, and the like. In one embodiment, each of the conductive barrier layer and the seed layer of conductive base layer 319 has the thickness in the approximate range of 10 to 300 nm, such that conductive base layer 319 has the thickness in the approximate range of 10 nm to 600 nm. In one embodiment, the conductive barrier layer, e.g., titanium, of conductive base layer 318 has the thickness of about 100 nm, and the seed layer, e.g., copper, of conductive base layer 318 has the thickness of about 200 nm. The choice of a material for the seed layer of conductive base layer 318 may depend on a choice of a material for conductive pads formed in openings 326, as described below.

Figure 19:
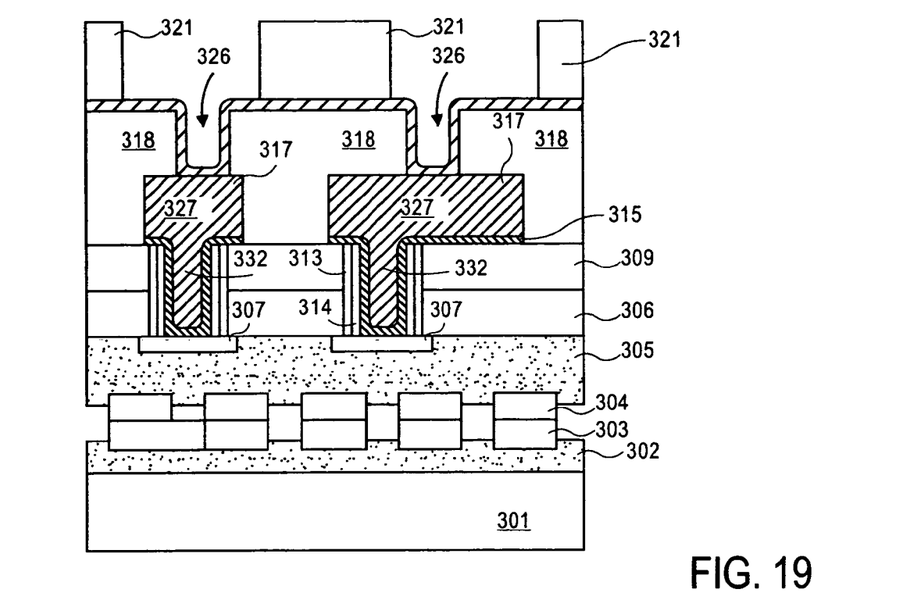
FIG. 19 is a view similar to FIG. 18, after patterning and etching a photoresist deposited on the second base layer.

FIG. 19 is a view similar to FIG. 18, after patterning and etching a photoresist 321 deposited on conductive base layer 319. As shown in FIG. 19, photoresist 321 is patterned and etched to expose portions of conductive base layer 319 covering internal sidewalls and bottom of openings 326 and portions of dielectric layer 318. Patterning and etching of photoresist 321 is known to one of ordinary skill in the art of semiconductor manufacturing.

Figure 20:
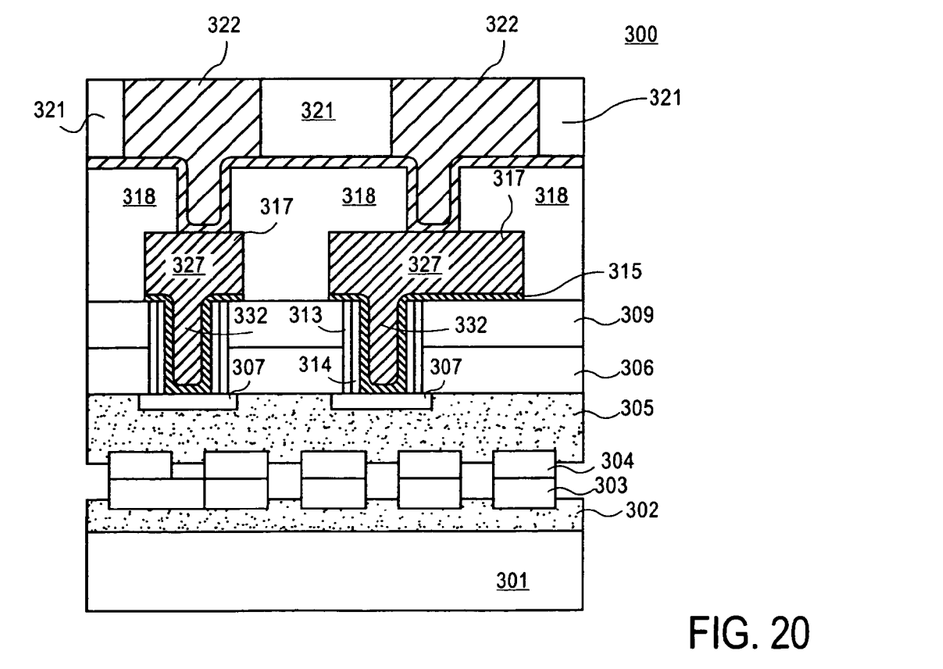
FIG. 20 is a view similar to FIG. 19, after conductive pads are deposited onto portions of the second base layer not covered by the photoresist.
Figure 21:
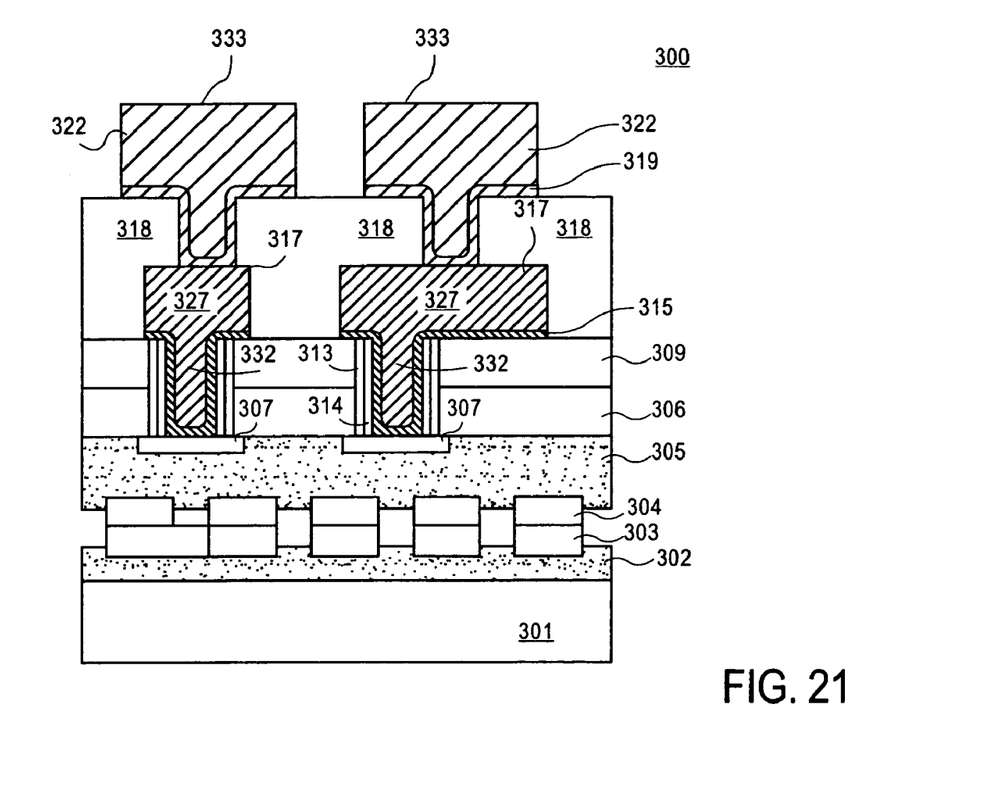
FIG. 21 is a view similar to FIG. 20, after exposed portions of the photoresist with underlying portions of the second base layer are removed.

FIG. 20 is a view similar to FIG. 19, after conductive pads ("bumps") 322 are deposited onto portions of conductive base layer 319 not covered by photoresist 321. As shown in FIG. 20, conductive bumps 322 are deposited onto conductive base layer 319, such that conductive bumps 322 are on conductive base layer 319 that covers top portions of dielectric layer 318, and the conductive material of conductive bumps 322 fills openings 326 above conductive lines 327. Conductive bumps 322 are formed on any portion of conductive lines 327 independent from location of vias 332. That is, the quantity and locations of conductive bumps 322 formed on conductive lines 327 are independent from the quantity and locations of vias 332. Many conductive bumps 322 can be formed on conductive lines 327 over each of vias 332 that substantially improve electrical power delivery to device layers 305 and 302. As shown in FIG. 21, the positions of conductive bumps 322 are offset relative to vias 332. In one embodiment, the amount of offset is determined by the width of conductive lines 327, and may be in the approximate range of 50 um to 1 mm. In one embodiment, conductive bumps 322 are Controlled Collapse Chip Connection ("C4") bumps. C4 bumps are known to one of ordinary skill in the art of semiconductor manufacturing. In one embodiment, a conductive material of conductive bumps 322 e.g., copper, is deposited onto exposed portions of conductive base layer 319, e.g., copper, by an electroplating process. During electroplating process, e.g., using a Secor™ technology, a conductive material, e.g., copper, or Pb—Sn alloy or Sn—Ag alloy, is plated into openings 326 to create conductive bumps 322. In one embodiment, conductive material for conductive bumps 322 is deposited onto portions of conductive base layer 319 using one of selective deposition technique known to one of ordinary skill in the art of semiconductor manufacturing, e.g., electroplating, electroless plating, and the like. In one embodiment, the choice of a material for conductive bumps 322 determines the choice of a material for the seed layer of conductive base layer 319. In one embodiment, if the material for conductive bumps 322 includes copper, conductive base layer 319 also includes copper. In another embodiment, if the material for conductive bumps 322 includes Pb-Sn compound, conductive base layer 319 includes a nickel layer having a thickness of about 4000 angstrom ("Å") deposited on a first titanium layer having the thickness of about 1000 Å, which is deposited on an aluminum layer having the thickness of about 1000 Å on a second titanium layer having the thickness of about 1000 Å.

FIG. 21 is a view similar to FIG. 20, after exposed portions of photoresist 321 with underlying portions of conductive base layer 319 are removed exposing portions of dielectric layer 318. Photoresist 321 may be removed using one of technique known to one of ordinary skill in the art of semiconductor manufacturing, e.g., using plasma etch ("ash"), or may be mechanically stripped off. The portions of conductive base layer 319 underlying photoresist 321 may be removed chemically, e.g., by etching, mechanically, e.g. by polishing, or using a combination thereof, as known to one of ordinary skill in the art of semiconductor manufacturing. As shown in FIG. 21, conductive bumps 322 extend through openings 326 down to conductive lines 327. As shown in FIG. 21, backside electrical connections 333 are provided between offset conductive bumps 322 through conductive lines 327 and vias 332 down to conductors 307 of the device layer 305 of 3D wafer stack 300. Thick conductive lines 327 allow delivery of increased amount of electrical power to device layers 305 and 302 of 3D wafer stack 300 through backside connections 333. Further, offsetting bumps 322 that connect to thick conductive lines 327 provide re-routing capabilities for electrical signals delivered to device layers 305 and 302 through backside connections 333. That is, re-routing capabilities for electrical signals delivered through backside connections 333 having offset bumps are provided without additional processing operations that significantly simplifies the manufacturing flow for backside connections 333. Additionally, offset bumps 322 deposited onto thick conductive lines 327 help substantially reduce stress, which may be induced onto low-k ILD dielectric 318 during attachment of 3D wafer stack 300 to e.g., conductive lands of a package, using back side connections 333.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method, comprising:
   forming a stack of a first wafer over a second wafer, wherein a substrate of the first wafer is on a top of the stack;
   depositing a first dielectric layer on the substrate of the first wafer;
   forming first vias in the first dielectric layer that extend through the substrate to a device layer of the first wafer;
   depositing a conductive layer in the first vias and on the first dielectric layer to form conductive lines;
   forming a second dielectric layer on the conductive layer;
   forming second vias in the second dielectric layer that extend to the conductive layer; and
   forming conductive bumps on the second dielectric layer that extend into the second vias.

2. The method of claim 1, further comprising
   thinning the substrate of the first wafer of the stack before depositing the first dielectric layer.

3. The method of claim 1, further comprising
   forming an insulating layer on sidewalls of the first vias before depositing the conductive layer.

4. The method of claim 1, wherein the depositing the conductive layer includes
   depositing a conductive base layer in the first vias and on the first dielectric layer;
   depositing a photoresist on the conductive base layer;
   patterning and etching the photoresist to expose portions of the conductive base layer;
   electroplating a conductive material to exposed portions of the conductive base layer; and
   removing the photoresist and portions of the conductive base layer underlying the photoresist.

5. The method of claim 1, wherein the conductive lines are formed to the thickness of at least 10 micron.

6. The method of claim 1, wherein the forming the conductive bumps includes
   offsetting the conductive bumps relative to the first vias.

7. The method of claim 1, wherein the forming the first vias includes etching openings in the first substrate using the first dielectric layer as a hard mask.

8. The method of claim 1, wherein the forming the stack includes bonding conductive pads of a first wafer to conductive pads of the second wafer.

9. A method to fabricate backside wafer connections for a wafer stack, comprising:
   bonding first conductive pads of a first wafer to second conductive pads of a second wafer to form a stack of the first wafer over the second wafer;
   thinning a substrate of the first wafer on a top of the stack;
   depositing a first dielectric layer on the substrate of the first wafer;
   forming first vias in the first dielectric layer that extend through the substrate to a device layer of the first wafer;
   forming an insulating layer on sidewalls of the first vias;
   depositing a conductive layer in the first vias and on the first dielectric layer to form conductive lines;
   forming a second dielectric layer on the first conductive layer;
   forming second vias in the second dielectric layer that extend to the first conductive layer; and
   forming conductive bumps on the second dielectric layer that extend into the second vias.

10. The method of claim 9, wherein the forming the insulating layer on the sidewalls of the first vias includes
    depositing the insulating layer on the first dielectric layer covering the sidewalls of the first vias;
    patterning the insulating layer; and
    etching the insulating layer to expose third conductive pads of the device layer.

11. The method of claim 9, wherein the depositing the conductive layer includes
    depositing a conductive base layer in the first vias and on the first dielectric layer;
    depositing a photoresist on the conductive base layer;
    patterning and etching the photoresist to expose portions of the conductive base layer;
    electroplating a conductive material to exposed portions of the conductive base layer; and
    removing the photoresist and portions of the conductive base layer underlying the photoresist.

12. The method of claim 9, wherein the conductive lines are formed to the thickness of at least 10 micron.

13. The method of claim 9, wherein the forming the conductive bumps includes
    offsetting the conductive bumps relative to the first vias.

14. The method of claim 9, wherein the conductive bumps are formed using Controlled Collapse Chip Connection ("C4") technology.

15. An apparatus, comprising:
    a stack of a first wafer on a second wafer, wherein a substrate of a first wafer is on a top of the stack;
    a first dielectric layer on the substrate of the first wafer;

first vias in the first dielectric layer that extend through the substrate to a device layer of the first wafer;

conductive lines on the first vias extending onto the first dielectric layer;

a second dielectric layer on and between the conductive lines;

conductive bumps on the second dielectric layer; and second vias in the second dielectric layer extending from the conductive bumps to the conductive lines.

16. The apparatus of claim 15, wherein the first vias include a first conductive material; and an insulating layer between the first conductive material and sidewalls of the first vias.

17. The apparatus of claim 15, wherein the insulating layer includes an oxide layer, or nitride layer.

18. The apparatus of claim 15, wherein the insulating layer includes a polyimide layer on an oxide layer.

19. The apparatus of claim 15, wherein the insulating layer includes a polyimide layer on a nitride layer.

20. The apparatus of claim 15, wherein the conductive lines have the thickness of at least 10 micron.

21. The apparatus of claim 15, wherein the conductive bumps offset the first vias.

22. The apparatus of claim 15, wherein the conductive bumps are Controlled Collapse Chip Connection ("C4") bumps.

23. The apparatus of claim 15, wherein the second vias offset the first vias.

24. The apparatus of claim 15, wherein a conductive material in the first vias and a conductive material of the conductive lines is the same.

25. The apparatus of claim 15, wherein the substrate of the first wafer has the thickness less than 30 microns.

* * * * *